US012201036B2

(12) United States Patent
Orcutt

(10) Patent No.: US 12,201,036 B2
(45) Date of Patent: Jan. 14, 2025

(54) LASER ANNEALING OF QUBITS USING A DIFFRACTIVE BEAM SPLITTER

(71) Applicant: International Business Machines Corporation, Armonk, NY (US)

(72) Inventor: Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 865 days.

(21) Appl. No.: 17/124,771

(22) Filed: Dec. 17, 2020

(65) Prior Publication Data

US 2022/0199890 A1 Jun. 23, 2022

(51) Int. Cl.
| H10N 60/01 | (2023.01) |
| B23K 26/06 | (2014.01) |
| B23K 26/067 | (2006.01) |
| B23K 26/351 | (2014.01) |
| B23K 101/40 | (2006.01) |
| G02B 19/00 | (2006.01) |
| G02B 27/10 | (2006.01) |

(52) U.S. Cl.
CPC ..... *H10N 60/0884* (2023.02); *B23K 26/0648* (2013.01); *B23K 26/067* (2013.01); *B23K 26/351* (2015.10); *G02B 19/0009* (2013.01); *G02B 19/0047* (2013.01); *G02B 27/1086* (2013.01); *H10N 60/0912* (2023.02); *B23K 2101/40* (2018.08)

(58) Field of Classification Search
None
See application file for complete search history.

(56) References Cited

U.S. PATENT DOCUMENTS

| 9,958,710 | B1 | 5/2018 | Morse et al. |
| 10,170,681 | B1 | 1/2019 | Rosenblatt et al. |
| 10,424,713 | B2 | 9/2019 | Rosenblatt et al. |
| 10,559,392 | B1 | 2/2020 | Saffman |
| 10,622,978 | B1 | 4/2020 | Debnath et al. |
| 2001/0029089 | A1* | 10/2001 | Tanaka ............... G02B 27/0966 438/479 |
| 2002/0151121 | A1* | 10/2002 | Tanaka ................. B23K 26/067 372/101 |
| 2006/0237404 | A1* | 10/2006 | Ishikkawa .......... B23K 26/0604 219/121.65 |

(Continued)

OTHER PUBLICATIONS

Examination Report No. 1 received for Australian Patent Application Serial No. 2021404394 dated Aug. 17, 2023, 3 pages.

(Continued)

*Primary Examiner* — Khaja Ahmad
(74) *Attorney, Agent, or Firm* — Amin, Turocy & Watson, LLP

(57) ABSTRACT

Apparatuses and methods are described for laser annealing of a qubit device using a plurality of optical beams. According to an embodiment, a method of tuning a qubit device can comprise generating an optical beam, splitting the optical beam in a plurality of optical beams, and annealing a Josephson junction of the qubit device by projecting the plurality of optical beams onto a region of the qubit device adjacent to the Josephson junction. The disclosed techniques can also be applied for annealing other types of electrical components of various microscale integrated circuit devices.

19 Claims, 11 Drawing Sheets

(56) References Cited

U.S. PATENT DOCUMENTS

| | | |
|---|---|---|
| 2018/0120599 A1 | 5/2018 | Morse et al. |
| 2019/0165246 A1* | 5/2019 | Rosenblatt ............. H10N 69/00 |
| 2020/0161446 A1 | 5/2020 | Anderson et al. |

OTHER PUBLICATIONS

International Search Report and Written Opinion received for International PCT Application Serial No. PCT/EP2021/085857 dated May 9, 2022, 13 pages.

Hertzberg, et al., "Laser-annealing Josephson junctions for yielding scaled-up superconducting quantum processors" Quantum Physics (quant-ph), arXiv:2009.00781v4 [quant-ph] Sep. 23, 2020, 16 pages.

Ip.com, "Technique for Modifying the Annealing and J(1) Properties of Josephson Junction Devices," IBM TDB 08-82 p1200-1206, IPCOM000050004D, IP.com Electronic Publication Date: Feb. 9, 2005, 4 pages.

Ip.com, "Fabrication of Planar Josephson Junctions by Laser Irradiation," IBM TDB 04-76 p3845-3846, IPCOM000085574D, IP.com Electronic Publication Date: Mar. 2, 2005, 2 pages.

Ip.com, "Laser Beam Control of Josephson Gate," IBM TDB 07-73 p378 IPCOM000079423D, IP.com Electronic Publication Date: Feb. 26, 2005, 2 pages.

Response to the communication pursuant to R 161 (1) and R 162 EPC received for European Patent Application Serial No. 21839467.4 dated Jan. 11, 2024, 7 pages.

\* cited by examiner

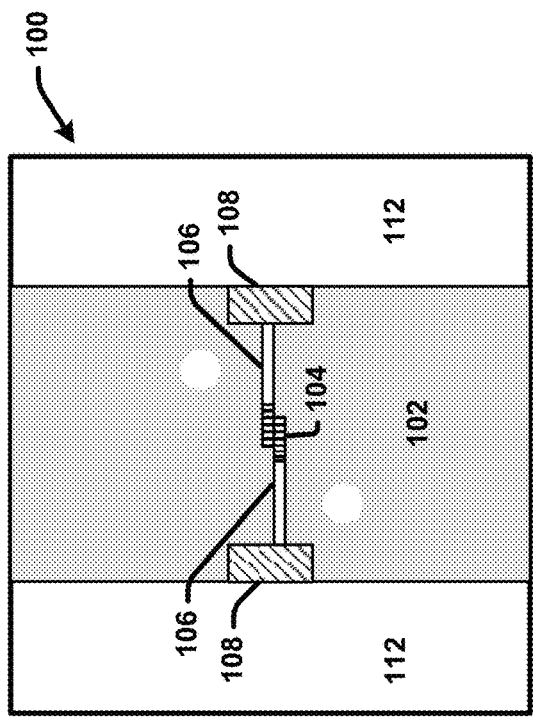
FIG. 3A
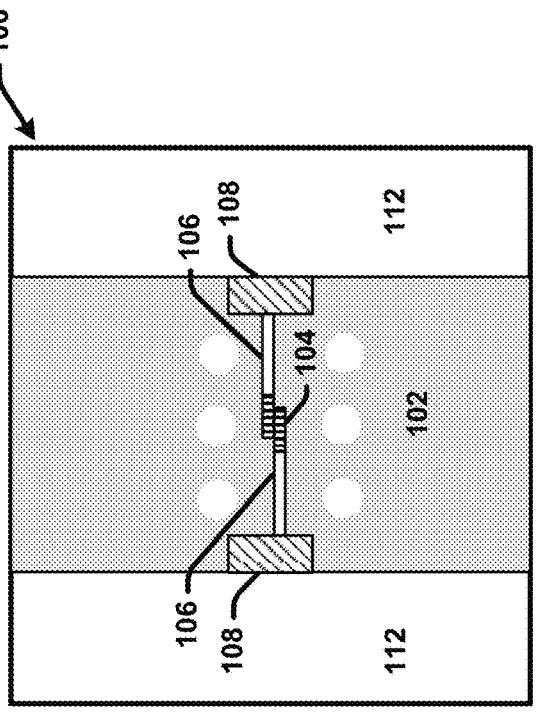
FIG. 3B
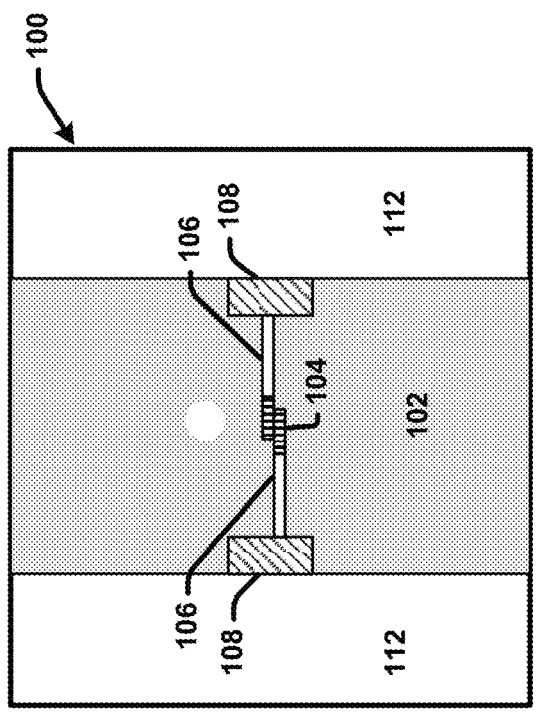
FIG. 3C
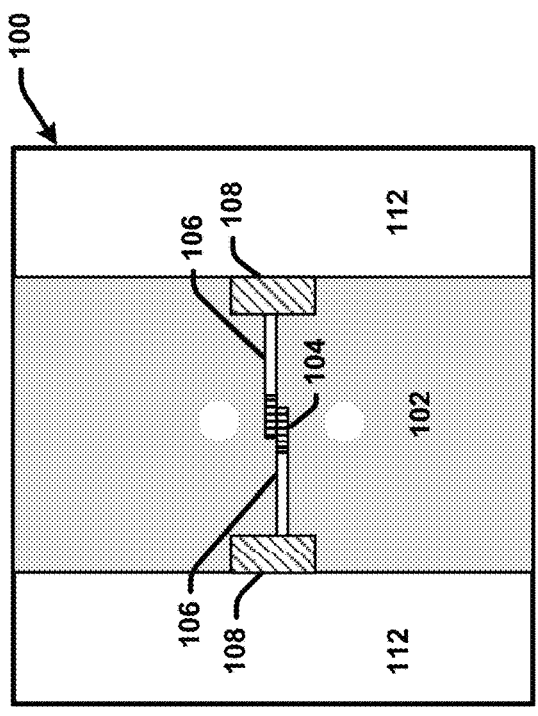
FIG. 3D
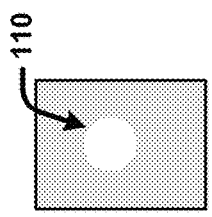

LASER ANNEALING OF QUBITS USING A DIFFRACTIVE BEAM SPLITTER

TECHNICAL FIELD

This application relates to laser annealing of qubit device electrical components using a plurality of optical beams generated using a diffractive beam splitter.

BACKGROUND

In quantum computing, a qubit or quantum bit is a unit of quantum information—the quantum analogue of the classical bit. A qubit is a two-state quantum-mechanical system. In large multi-qubit systems, a qubit's resonant frequency must be precisely controlled to avoid signaling collisions. Due to semiconductor processing variabilities, a qubit's original resonant frequency as fabricated typically deviates from design targets. Laser annealing techniques have been developed to adjust qubit frequencies post-fabrication. However, due to qubit microscale size and design constraints, these laser-annealing techniques are met with considerable technical challenges.

SUMMARY

The following presents a summary to provide a basic understanding of one or more embodiments of the present disclosure. This summary is not intended to identify key or critical elements or to delineate any scope of the particular embodiments or any scope of the claims. Its sole purpose is to present concepts in a simplified form as a prelude to the more detailed description that is presented later. In one or more embodiments described herein, apparatuses and methods are described for laser annealing of qubit device electrical components using a plurality of optical beams. The disclosed techniques can also be applied for annealing other types of electrical components of various microscale integrated circuit devices.

According to an embodiment, a method for forming a qubit can comprise providing a substrate having a Josephson junction positioned between two capacitive plates, and annealing the Josephson junction by projecting a plurality of optical beams onto a region of the substrate located between the Josephson junction and the two capacitive plates. In various implementations, the plurality of optical beams comprise Gaussian beams and the method further comprises generating the Gaussian beams via transmission of a laser generated Gaussian beam through a diffractive optical element. In some implementations, the projecting comprises generating an illumination pattern on the region that comprises spatially separated optical spots. The plurality of optical beams indirectly heat the Josephson junction, resulting in the annealing of the Josephson junction.

According to another embodiment, a method for forming a qubit can comprise providing a substrate having a Josephson junction positioned between two superconductor leads, and annealing the Josephson junction by projecting a plurality of optical beams onto a region of the substrate adjacent to the Josephson junction and the two superconductor leads.

In another embodiment, a method of tuning a qubit device can comprise generating an optical beam, splitting the optical beam in a plurality of optical beams, and annealing a Josephson junction of the qubit device by projecting the plurality of optical beams onto a region of the qubit device adjacent to the Josephson junction.

Another embodiment is directed to an apparatus for annealing a microscale integrated device. The apparatus can comprise an optical source that generates an optical beam, a diffractive beam splitter that splits the optical beam into a plurality of optical beams; and a lens system that projects the plurality of optical beams onto the microscale integrated device for annealing the microscale integrated device. In one or more implementations, the lens system comprises a first lens that that focusses the plurality of optical beams onto an image plane, and a second lens that receives the image plane and projects the image plane onto the microscale integrated device for annealing the microscale integrated device. In various embodiments, the image plane comprises a plurality of spatially separated optical spots respectively generated by the plurality of optical beams.

In another embodiment, an apparatus for annealing an electrical component of a microscale integrated device can comprise an optical source that generates an optical beam, and a diffractive beam splitter that splits the optical beam into a plurality of optical beams. The apparatus can further comprise a lens system that projects the plurality of optical beams onto a region of the microscale integrated device adjacent to the electrical component.

In some embodiments, elements described in connection with the disclosed methods and systems can be implemented by a computer and embodied in different forms such as an apparatus, a computer system, or another form.

DESCRIPTION OF THE DRAWINGS

FIGS. 3A-3D illustrate different annealing patterns formed on a qubit device in accordance with one or more embodiments.

DETAILED DESCRIPTION

Figure 1:
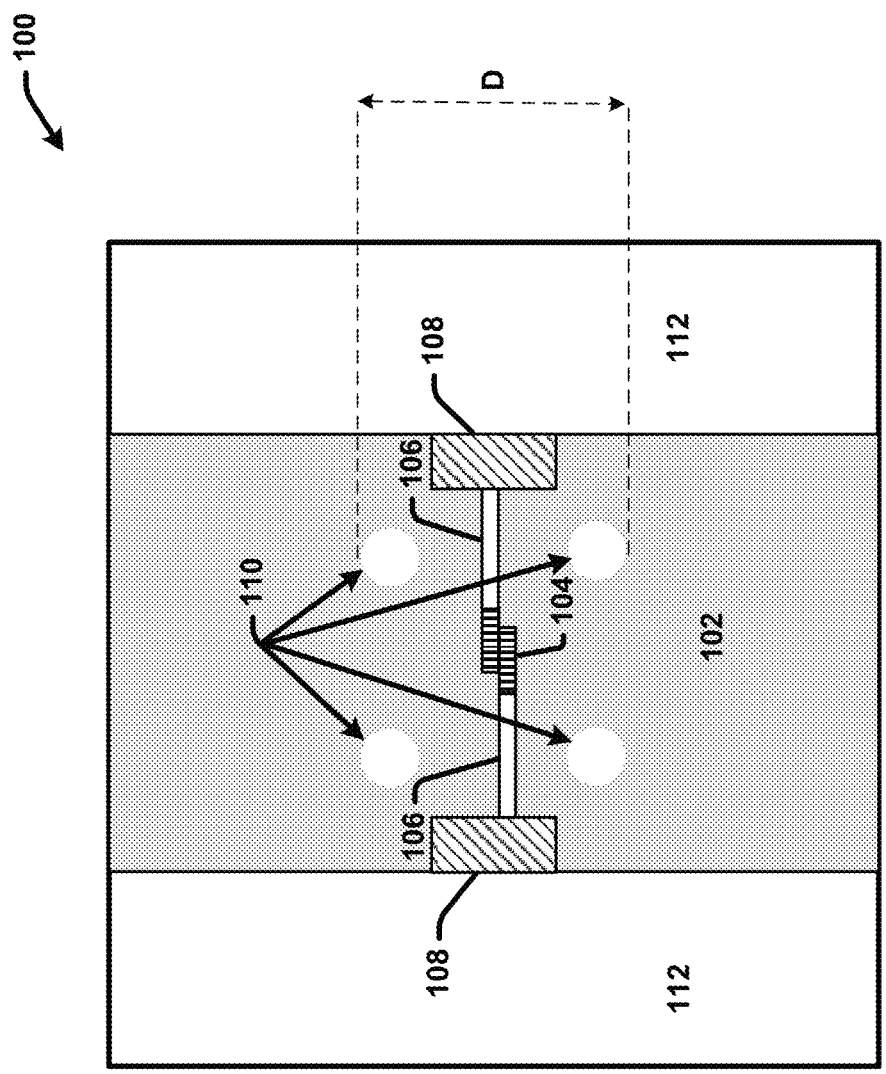
FIG. 1 illustrates an example qubit device with a projected annealing pattern formed thereon in accordance with one or more embodiments.

The following detailed description is merely illustrative and is not intended to limit embodiments and/or application or uses of embodiments. Furthermore, there is no intention to be bound by any expressed or implied information presented in the preceding Technical Field or Summary sections, or in the Detailed Description section.

The disclosed subject matter relates generally to the field of qubit manufacturing for quantum computing, and more specifically to allocating a design frequency to a qubit following formation of the Josephson junction. While the present disclosure is not necessarily limited to such applications, various aspects of the disclosure may be appreciated through a discussion of various examples using this context.

In one or more embodiments, a qubit can comprise a Josephson junction formed on a substrate between two capacitive plates. The qubit further comprises superconducting leads formed on either side thereof that connect the Josephson junction to the capacitive plates. The disclosed subject matter provides a system for annealing the Josephson junction indirectly by heating an area of the substrate around the Josephson junction using a plurality (e.g., two or more) of optical beams. In particular, the optical beams are generated by splitting a single optical beam into two or more beams using a diffractive beam splitter. In various embodiments, the single optical beam comprises a Gaussian beam. The disclosed system further includes one or more projection components (e.g., a relay lens unit that project the optical beams on the region of the substrate around the Josephson junction. In particular, the projected optical beams form an illumination pattern on the substrate that includes two or more spatially separated optical spots that do not overlap with the Josephson junction, the superconducting leads, or the capacitive plates. The plurality of optical beams or optical spots indirectly heat the Josephson junction, resulting in the annealing of the Josephson junction and altering a resistance/resonant frequency of the Josephson junction.

By avoiding direct laser irradiation of the Josephson junction, the disclosed techniques minimize shifting and damaging the Josephson junction (especially in the presence of liftoff residue). In addition, by using a plurality of optical beams, the disclosed annealing techniques produce a uniform junction temperature even in the presence of laser misalignment. In particular, the disclosed techniques eliminate precise optical path alignment constraints imposed by prior systems that use a ring illumination approach. Such systems use an axicon to shape the laser around the Josephson junction in a ring shape. However, these systems require extremely precise beam alignment to ensure the ring illumination is positioned directly over the center of the Josephson junction, which if not, results in the ring laser beam crossing and damaging the superconducting leads. This precise beam alignment is difficult to achieve with a ring illumination pattern as the size of the ring changes significantly with minor focal variation. In addition, extreme alignment is needed to precisely align the source beam through the conical point of the axicon to generate the illumination ring. Further, axicons produces a Bessel function in the post-focal plane, making the focal plane highly sensitive to misalignment errors.

Although various embodiments of the disclosed annealing techniques are described for usage in annealing a qubit Josephson junction, the disclosed techniques can also be applied for annealing other types of electrical components of qubits and other microscale integrated circuit devices to modify a state or property of the electrical components. For example, such other electrical components can include, but are not limited to, a thin film metal structure, a thin film metal structure formed with a superconducting metal, a thin film wire, an air bridge, an electrode, a capacitor and/or a resonator.

One or more embodiments are now described with reference to the drawings, wherein like referenced numerals are used to refer to like elements throughout. It should be appreciated that the various structures depicted in the drawings (e.g., the different layers, substrates, wafers, electrical components, etc.) are merely exemplary and are not drawn to scale. In the following description, for purposes of explanation, numerous specific details are set forth in order to provide a more thorough understanding of the one or more embodiments. It is evident, however, in various cases, that the one or more embodiments can be practiced without these specific details. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop mean that a first element is present on a second element, wherein intervening elements may be present between the first element and the second element. As used herein, unless otherwise specified, the term directly used in connection with the terms on, overlying, atop, on top, positioned, positioned atop, contacting, directly contacting, or the term direct contact, mean that a first element and a second element are connected without any intervening elements between them. As used herein, terms such as upper, lower, above, below, directly above, directly below, aligned with, adjacent to, right, left, vertical, horizontal, top, bottom, and derivatives thereof shall relate to the disclosed structures as oriented in the drawing figures. The term "aligned with" is used herein to refer to an element being positioned directly along a same line vertical or horizontal line relative to one another element. For example, the term aligned with as used herein can refer to a first element being directly above or below a second element.

The term substantially, or substantially similar, refers to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

The terms "substrate," "wafer" and "chip" are used herein interchangeably unless context warrants particular distinction amongst the terms. The term "device chip," is herein to refer to a chip, substrate, or wafer that corresponds to or includes an electrical component or device. The terms "electrical device," "electrical component," "electrical element," "electrical structure," and the like are used herein interchangeably unless context warrants particular distinction amongst the terms.

Referring now to FIG. 1 illustrated is an example qubit device 100 with a projected annealing pattern formed thereon in accordance with one or more embodiments. In this example, the projected annealing pattern includes four spatially separated optical spots 110. As described in greater detail infra, this quad-spot illumination pattern can be generated via the aligned projection of corresponding optical beams onto the qubit device 100 via one or more of the disclosed laser annealing systems that employ a diffractive beam splitter (e.g., system 200 shown in FIG. 2 and additional systems disclosed herein).

In accordance with the embodiment shown, the qubit device 100 can comprise a Josephson junction 104 formed on a substrate 102 between two capacitive plates 112 (also referred to as capacitive pads). The qubit device 100 further includes contact regions 108 formed on opposite sides of the leads 106 that electrically connect the leads 106 to the leads to the capacitive plates 112. In some embodiments, these contact regions 108 can be removed. For example, the contact regions 108 can be included in the qubit device 100 in embodiments in which the leads 106 and the capacitive plates 112 are fabricated in separate steps and/or different metals. For instance, in some embodiments, the leads 106 can be fabricated from aluminum (Al) and the capacitive plates 112 can be fabricated from niobium (Nb). With these implementations, the contact regions 108 can be formed with Al, Nb, AlNb, or another superconducting material to provide a superconducting contact for the leads 106 to the capacitive plates 112.

The material used for the substrate 102 can vary. Some suitable materials for the substrate 102 include silicon, sapphire, magnesium oxide (MgO), or a combination thereof. The qubit device 100 further comprises leads 106 formed on either side of the Josephson junction 104 that electrically connect the Josephson junction 104 to the capacitive plates 112. In particular, the leads 106 are formed on opposite sides of the Josephson junction 104 between the sides of the Josephson junction 104 and the capacitive plates 112.

In various embodiments, the leads 106 are formed with a superconducting material, such as but not limited to, aluminum (Al), aluminum oxide (AlOx), niobium (Nb), niobium nitride (NbN), niobium carbonitride (NbCN), niobium titanium nitride (NbTiN), and lead (Pb). With these embodiments, the leads 106 can be or correspond to superconducting leads. However, other conductive or superconductive metal materials can be employed for the leads 106.

In various embodiments, the Josephson junction 104 can be comprised of superconducting upper and lower layers of Al with an inner contact of aluminum-oxide connecting the upper and lower layers. With these embodiments, the Josephson junction 104 can be considered an aluminum/aluminum-oxide/aluminum (Al/AlOx/Al) trilayer structure. Each (or in some implementations one or more) of the Al layers of the Al/AlOx/Al trilayer can be connected to the capacitive plates 112. In some implementations, the Al/AlOx/Al can be superconducting at a superconducting critical temperature of 1.2 kelvin (K). With these embodiments, the Josephson junction 104 can be fabricated on the substrate 102 using Al as a starting compound to form the Al/AlOx/Al) trilayer structure. The material of the substrate 102 can further be selected to reduce the dielectric loss tangent at low temperatures. The substrate material can also comprise a material which can be etched selectively to the superconducting and dielectric material to be used for the Josephson junction 104 (e.g., a high resistivity silicon wafer).

Additionally, or alternatively, the substrate 102 can be formed with one or more silicon wafers and a bilayer of resist can also be spun on the one or more silicon wafers that comprises of a copolymer methyl methacrylate (MIVIA) layer and a subsequent thinner layer of polymethyl methacrylate (PMMA). With these embodiments, the Josephson junction 104 can be formed on the substrate 104 be writing a pattern for the Josephson junction 104 into the resist using electron-beam lithography. Thereafter, the Josephson junction 104 can be developed in an MIBK:IPA solution (Methyl Isobutyl Ketone (MIBK) Isopropyl alcohol (IPA)) (1:3) for about one minute, which eats away all the areas exposed to the electron beam. The MIVIA layer is more sensitive to the electron beam, which creates areas of undercut PMMA. As such, a suspended bridge out of the PMMA, also called a Dolan bridge, can be made with no MMA beneath. The entire sample can further be placed in an electron-beam evaporator where Al is evaporated at two angles with oxidation (in an inert atmosphere) between Al evaporations. The resulting Josephson junction 104 is formed in the overlap area. The remaining resist and unwanted metal can be removed by placing the sample in acetone. Using this lift-off technique, junction areas can be made ranging from 0.01 squared micrometers ($\mu m^2$) to about 1.0 $\mu m^2$.

The capacitive plates 112 can also be formed with one or more superconducting materials, such as, but not limited to, Al, AlOx, Nb, NbN, NbCN), NbTiN), and Pb. In an example embodiment, the capacitive plates 112 can comprise a layered structure of niobium, aluminum, aluminum-oxide, aluminum, and niobium. The position and size of the capacitive plates 112 relative to the Josephson junction 104 can vary. In an example embodiment, the capacitive plates 112 can be about 1.0 to 100 μm apart and the Josephson junction 104 can be centered therebetween. In another example embodiment, the capacitive plates 112 can have a width of about 5.0 to about 500 μm (e.g., the dimension substantially parallel to the Josephson junction 104), a length of about 1.0 to about 200 micrometers (e.g., the dimension substantially perpendicular to the Josephson junction 104), and a height (e.g., a thickness) of about 10 to about 500 nanometers off the surface of substrate 102.

Figure 2:
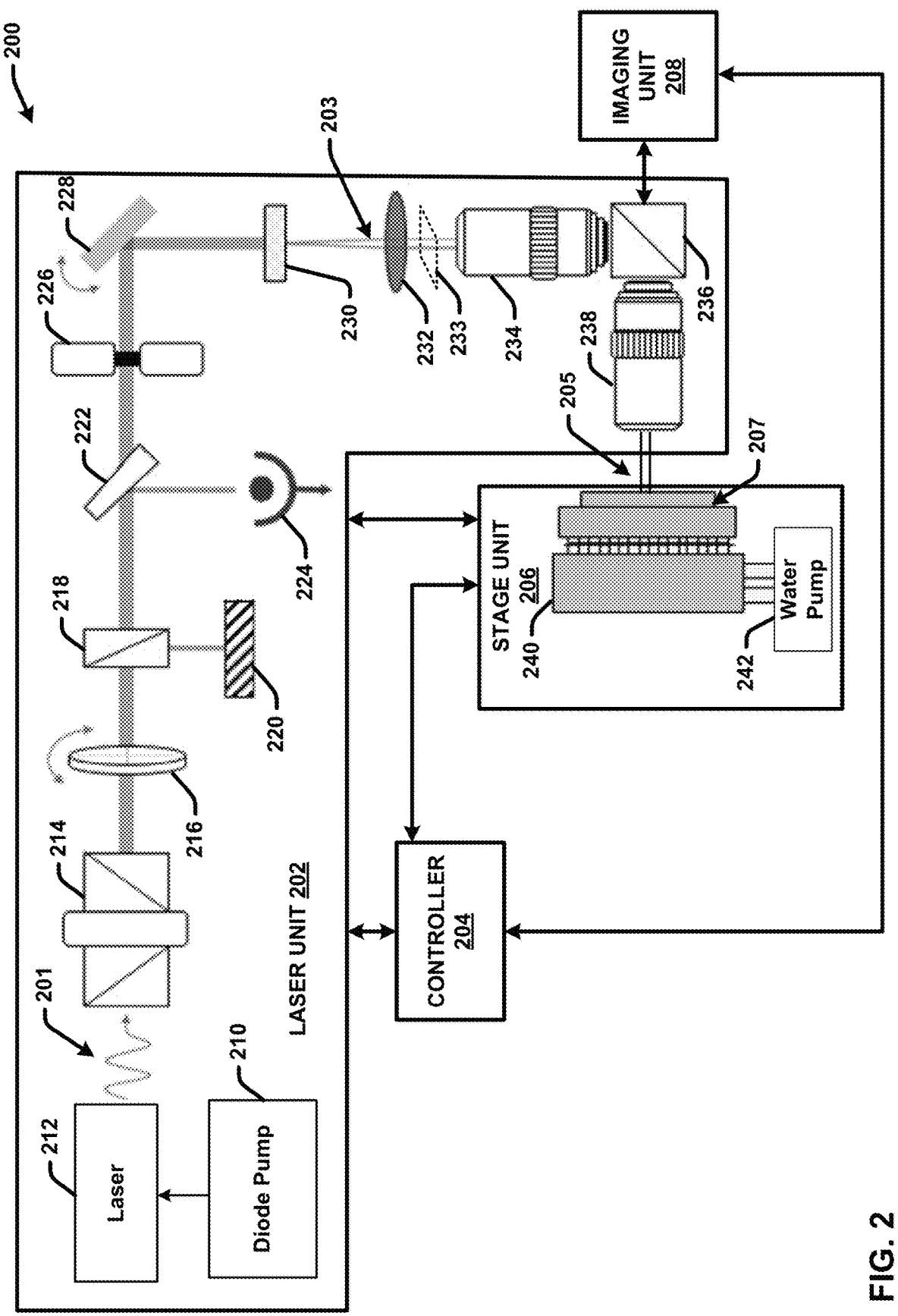
FIG. 2 illustrates an example apparatus for annealing an electrical component of a microscale integrated device in accordance with one or more embodiments.

FIG. 2 illustrates an example system 200 for annealing an electrical component of a microscale integrated device 207 in accordance with one or more embodiments. For example, system 200 can be used to anneal the Josephson junction 104 of qubit device 100, as well as other electrical components of the qubit device 100 and/or other microscale integrated devices. Repetitive description of like elements employed in respective embodiments is omitted for sake of brevity.

System 200 includes a laser unit 202, an imaging unit 208, a stage unit 206 and a controller 204. The laser unit 202 provides the laser 212 for annealing one or more electrical components of a microscale integrated device 207 placed on the stage 240 of the stage unit 206. For example, in various embodiments, the microscale integrated device 207 can be or correspond to qubit device 100 and system 200 can be used to anneal the Josephson junction 104 of the qubit device 100 by indirectly heating the Josephson junction 104. The laser unit 202 further includes several components for controlling and manipulating the laser 212 prior to projection onto the microscale integrated circuit device 207, including a diffractive beam splitter 230 that provides for splitting the laser beam into a plurality of optical beams 203. These components are discussed in greater detail below. The imaging unit 208 can include a camera and other components that facilitate aligning the optical beams 203 onto the target region of the microscale integrated device 207. For example, in various embodiments in which the microscale integrated device 207 correspond to qubit device 100, the target region can include a region of the substrate 102 around or adjacent to the Josephson junction 104 and the leads 106.

In various embodiments, the laser unit 202, the imaging unit 208 and the stage unit 206 can be physically coupled/attached to one another and form an integrated apparatus. In other embodiments, one or more of the laser unit 202, the imaging unit 208 and/or the stage unit 206 can be physically detached yet positioned in proximity to one another. The controller 204 can be communicatively and/or operatively coupled to the laser unit 202, the imaging unit 208 and/or the stage unit 206. In some embodiments, the controller 204 can also be physically coupled/attached to one or more of the laser unit 202, the imaging unit 208, and the stage unit. The controller can include hardware and/or software the provides for electrically controlling (e.g., via one or more wired and/or wireless communication signals) one or more operations of the laser unit 202, the imaging unit 208, and/or the stage unit 206.

In the embodiment shown, the laser source includes a diode pump 210 that generates the laser 212. In some implementations, the laser 212 generated by the diode pump 210 can include a 532 nanometer (nm) (frequency doubled) solid-state laser (e.g., a second harmonic generation (SHG) laser). In various embodiments, the laser 212 can be or correspond to a Gaussian beam. Prior to the diffractive beam splitter 230, the laser unit 202 further includes an isolator 214, a half-wave plate 216, a first polarizing beam splitter 218 connected to a dump 220, a wedge 222 connected to a silicon-photodiode 224, an electronic shutter 226 and a steering mirror 228.

In accordance with system 200 the laser 212 is initially passed through the isolator 214 (as indicated by arrow 201) which directs the flow of the laser beam in the desired direction toward the half-wave plate 216. The half-wave plate 216 and the first polarizing beam splitter 218/dump 210 are then used to actively control/calibrate the power of the focused laser beam, which is adaptively adjusted based on a pick-off beam generated via the wedge 222 and measured using the downstream silicon photodiode 224. In various embodiments, this power adjustment can be measured and controlled via the controller 204. In this regard, the half-wave plate 216 shifts the polarization direction of the beam. In some embodiments, the half-wave plate 216 can have an adjustable (e.g., electronically-controlled via the controller 204) rotation in order to adjust the total attenuation (e.g., by rotating the polarization incident on the polarizer first polarizing beam splitter 218) to the desired power level (e.g., as also electronically-controlled adjusted using the controller 204). In some embodiments, the first polarizing beam splitter 218 can be or include an optical filter that allows a specific polarization of light waves associated with the beam to pass through the optical filter and blocks light waves of other polarizations. In some embodiments, the first polarizing beam splitter 216 can convert undefined or mixed polarization of light waves associated with the beam into a beam of well-defined, polarized light.

The laser beam further passes through the wedge 222 and is exposed to the electronic shutter 226. In some embodiments, the electronic shutter 226 can control an anneal duration of the beam. For example, the electronic shutter 226 can open in order to apply the downstream optical beams 203 generated therefrom to the microscale integrated device 207 for a desired duration of time (e.g., 10 seconds, 20 seconds, 30 seconds, 1 minute, etc.). The electronic shutter 222 can be configured (e.g., as controlled via the controller 204) to automatically close after the defined duration of time. The laser power level and the pulse duration can be controlled to achieve the desired resistivity level of the annealed Josephson junction 104.

The steering mirror 228 further directs the optical beam toward the beam diffractive beam splitter 230. In various embodiments, the steering mirror 228 can be correspond to a mechanical mirror mount which directs the beam via pattern recognition to the diffractive beam splitter 230.

The diffractive beam splitter 230 splits the incoming beam into two or more outgoing optical beams 203 with slightly different angles relative to one another. In various embodiments, the diffractive beam splitter comprises a holographic optical element that imparts a precise angle (e.g., a 0.5-degree shift) to the incoming beam in a plus and minus angular direction relative to a reference plane to generate the outgoing beams 203. In some embodiments, the diffractive beam splitter 230 also suppresses the underacted or straight through light.

The number of optical beams 203 generated by the diffractive beam splitter 203 can vary. In various embodiments, the diffractive beam splitter 230 can comprise a 2-by-2 diffractive beam splitter that splits the single incoming beam into four separate optical beams. For example, in the embodiment shown in FIG. 2, although two lines are depicted for the optical beams 203 (and optical beams 205), in an embodiment in which the diffractive beam splitter 230 comprises a 2-by-2 diffractive beam splitter, each of these lines can correspond to two parallel (vertically stacked) beams (e.g., a total of four beams). With these embodiments, the final beam illumination pattern that is projected onto the microscale integrated device 207 can correspond to the quad-spot pattern illustrated in FIG. 1. For example, with reference again to FIG. 1, in various embodiments, the optical spots 110 correspond to four optical beams generated by a 2-by-2 diffractive beam splitter and projected onto the substrate 102 via the laser unit 202. In this example, the illumination pattern comprises four substantially evenly space optical spots positioned on a target region of the substrate 102 around Josephson junction 104 and the leads 106. The distance (D) between the illumination spots 110 can be tailored/controlled such that the optical spots are positioned around and near the Josephson junction 104 and the leads 106. In some embodiments, the distance D can be between about 5 μm to about 20 μm, and more preferably between about 10 μm and about 15 μm.

In other embodiments, the diffractive beam splitter 203 can be configured to generate 2 beams, 3 beams, 5 beams, 6 beams, and so on, with defined illumination patterns tailored to different applications.

FIGS. 3A-3D illustrate different illumination patterns that can be formed on qubit device 100 using different diffractive beam splitters accordance with one or more embodiments. FIG. 3A illustrates an example illumination pattern that corresponds to a single Gaussian beam projected onto the substrate 102 just outside the Josephson junction 104. This embodiment illustrates heating/annealing the qubit device 100 with the diffractive beam splitter 230 removed from the annealing path. FIG. 3B illustrates an example illumination pattern that includes two optical spots positioned on the substrate 102 at adjacent corners of the Josephson junction 104 that can be generated by a 2-by-1 diffractive beam splitter. FIG. 3C illustrates an example illumination pattern that includes two optical spots positioned on the substrate 102 directly above and below one another on opposite sides the Josephson junction 104 that can be generated by another 2-by-1 diffractive beam splitter. FIG. 3D illustrates an example illumination pattern that includes 6 optical spots positioned on the substrate 102 directly above and below one another on opposite sides the Josephson junction 104 that can be generated by a 2-3 diffractive beam splitter. Various other illumination patterns are also envisioned.

With reference again to FIG. 2, in accordance with system 200, the laser unit 202 further includes a lens system that includes an aspheric lens 232 and a relay lens unit that includes a first objective lens 234, a second polarizing beam splitter 236 and a second objective lens 238. In the embodiment shown, the aspheric lens 232 immediately follows the diffractive beam splitter 230. With this embodiment, the optical beams 203 generated by the beam splitter 230 can pass through the aspheric lens 232 which can direct and focus the optical beams 203 to the downstream relay lens unit. In some embodiments, the aspheric lens can reduce or eliminate spherical aberration and other optical aberrations (e.g., astigmatism) present in the optical beams 203.

In various embodiments, the aspheric lens 232 provides for focusing the optical beams 203 onto an image plane 233 to create the desired illumination pattern (e.g., the illumination pattern with the four optical spots shown in FIG. 1, the illumination patterns shown in FIGS. 3A-3D, or the like) for projecting onto the target region of the microscale integrated device 207 (e.g., a region of the substrate 102 adjacent to and/or around the electrical component to be annealed). In this regard, the image plane 233 corresponds to a virtual plane between the aspheric lens 232 and the first objective lens 234 at the effective focal length of the aspheric lens 232 and the working distance of the first objective lens 234. The relay lens unit further provides for projecting the image plane/illumination pattern onto the target region of the microscale integrated device 207. In the embodiment shown, the projected illumination pattern includes a plurality of optical beams 205 or optical spots corresponding to the optical beams. The imaging unit 208 can facilitate aligning the optical beams 205 with the target region of the microscale integrated device 207.

In some embodiments, the first objective lens 234 and the second objective lens 238 can effectively generate a demagnification of the illumination pattern generated by the optical beams 203 output from the diffractive beam splitter 230 and projected onto the image plane 233. In some embodiments, the demagnification can be about a 5-times down demagnification. For example, in an embodiment in which the diffractive beam splitter 230 generates four separate optical beams corresponding to the illumination pattern in FIG. 1, the output spacing between the optical beams 203 may be about 50 μm. With a 5-times down demagnification, the relay lens unit can reduce the spacing between the optical beams 203 from about 50 μm such that the spacing between the optical beams 205 for the final illumination pattern is about 10 μm.

In some embodiments, the first objective lens 234 can include a low magnification objective lens and the second objective lens 238 can include a long wide-range (WD) objective lens. In some implementations, the low magnification objective lens can have about a 100 millimeter (mm) working distance. In various embodiments, the low magnification objective lens can provide a portion of the demagnification of the optical beams 203 discussed above and the long WD objective lens can further decrease the magnification of the illumination pattern output by the low magnification lens.

In various embodiments, the second polarizing beam splitter 236 can split the optical beams/illumination pattern output by the first objective lens into two orthogonal, linearly polarized portions. The respective portions can essentially be mirror images or copies of one another. The second polarizing beam splitter 236 can reflect the first portion at a 90 degree angle toward the second objective lens 238 and the microscale integrated device 207, and the second portion can be transmitted though the second polarizing beam splitter 236 away from the microscale integrated device 207. In some embodiments, the first portion and the second portion can each retain some of the original physical properties of the laser beams/illumination pattern beam before being split by the second polarizing beam splitter 236 (e.g., each of the portions can be identical to one another and identical to the beam before splitting). For example, if the beams have a 532 nm wavelength, each of the portions will have the same 532 nm wavelength. In addition, each or the portions can essentially correspond to copies of the same illumination pattern. In various embodiment, the first portion can include S-polarized light and the second portion can include P-polarized light (or vice versa). In this regard, P-polarized (from the German parallel) light has an electric field polarized parallel to the plane of incidence, while S-polarized (from the German senkrecht) light is perpendicular to this plane.

The output of the second objective lens 238 includes optical beams 205 having a desired illumination pattern that is projected onto the target region of the integrated microscale device 207. For example, in various embodiments in which the microscale integrated device 207 corresponds to qubit device 100, the target region can include a portion of substrate 102 adjacent to or around (but not overlapping) the Josephson junction 104 and the leads 106. This results in heating the substrate 102 and indirectly heating the Josephson junction 104 to a desired temperature that results in annealing the Josephson junction 104 and altering a state or property of the Josephson junction 104. In the embodiment shown, the stage unit 206 can include a stage 240 and a water pumper 242. With this embodiment, the stage 240 can be or correspond to a dual stage with a thermoelectric cooler and thermal mount that provides for cooling the stage in association with the annealing process. In some embodiments, the stage 240 can also be or correspond to an X/Y/Z stage that can mechanically move in three directions to facilitate aligning the target region of the microscale integrated device 207 in line-of-sight of the second objective lens 238. With these embodiments, the stage 240 can be manually adjustable and/or adjusted/moved as controlled via the controller 204.

In various embodiments, the heating of the target region of the substrate 102 around the Josephson junction 104 can be used to alter the resistance of the Josephson junction 104. The power level of the diode pump 210 and the duration of the exposure (e.g., the pulse duration of the optical beam as controlled via the electronic shutter 228) can control the desired resistivity to be obtained. For example, in one implementation, a low power laser beam with a 532 nm wavelength can be used to generate the optical beams 205 which in turn can be projected onto the region of the substrate around the Josephson junction 104 for about one second. Application of the low power level optical beams a one second duration can increase the resistance of the Josephson junction 104 (e.g., at a low power level, the laser may supply enough thermal energy to increase resistance in the Josephson junction). The increased resistance can allow the qubit associated with the Josephson junction to decrease in frequency.

In some embodiments, the diode pump 210 can have four power settings, with the first two power settings being considered "low power," the third power setting being considered a "middle power," and the fourth power setting being considered a "high power." At the low power setting and an anneal duration of about 20 seconds, the resistance of a Josephson junction 104 can increase from a range of 2% to 100%. Additionally, the frequency of a qubit can be seen to decease by 0.5% to 1.5% during the duration of the beam annealing a Josephson junction 104 contained within the qubit while at the low power settings. The resistance change of the Josephson junction 104 and frequency change of the qubit device 100 can remain after beams are removed.

At the middle power setting and anneal duration of about 20 seconds, the resistance of the Josephson junction 104 can increase from a range of 13% to 4%. The highest increase of resistance change (13%) can be seen after about one to five seconds of exposure and the lowest increase of resistance change (4%) can be seen during the Josephson junction's extended exposure by the beams 205 (e.g., 15 seconds to 20 seconds). That is, the resistance initially increases quickly after being indirectly exposed to the beams 205 at the middle power setting for the first five seconds, and then slowly increases in resistance for the duration of exposure. Additionally, the frequency of the qubit device 100 can decrease between 1.5% and 2.5% while indirectly applying the beams 205 at the middle power setting to the Josephson junction 104 contained within the qubit. The resistance change of the Josephson junction 104 and frequency change of the qubit device 100 can remain after the beams are removed.

Indirectly annealing the Josephson junction 104 with the beams 205 at the high-power setting for about 20 seconds can be used to decrease the resistance of the Josephson junction 104 from a range of 2% to 12%. The lowest decrease of resistance change (1%) can be seen during the Josephson junction initially being exposed to the beams 205 (e.g., 1 second to 5 seconds), and the highest decrease of resistance change (7%) can be seen during the Josephson junction's extended exposure to the beams (e.g., 15 seconds to 20 seconds). That is, the resistance initially decreases slowly after being indirectly exposed to the beams 205 at the high-power setting for the first five seconds, and then quickly decreases in resistance for the duration of exposure to the beams 205. Additionally, the frequency of the qubit device 100 can increase from a range of 1% to 6% during the duration of the beams indirectly annealing a Josephson junction 104 contained within the qubit while at the high-power setting (e.g., the frequency of the qubit may have an opposite sign change at the high-power setting). The resistance change of the Josephson junction and frequency change of the qubit can remain after beams are removed.

Figure 4:
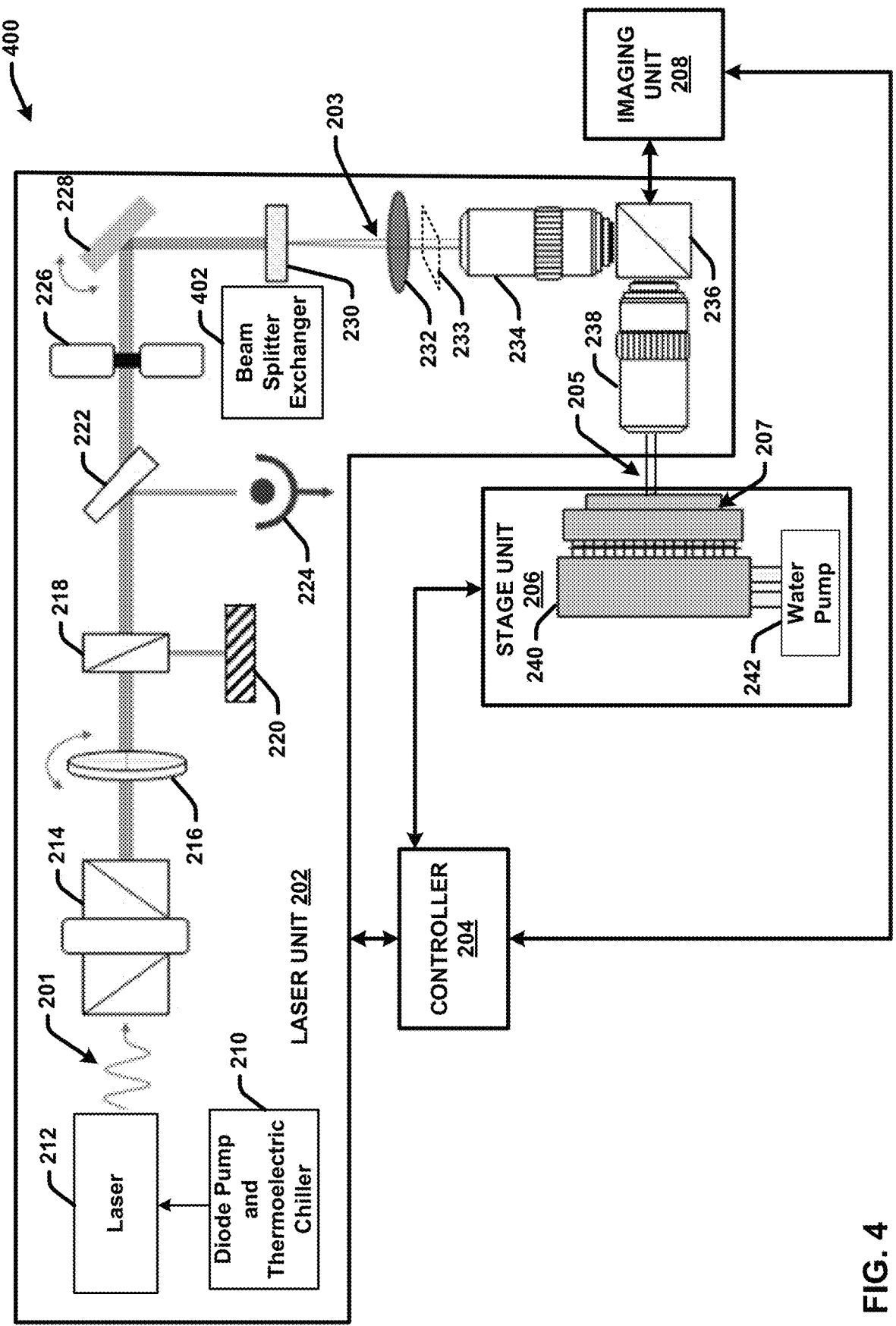
FIG. 4 illustrates another example apparatus for annealing an electrical component of a microscale integrated device in accordance with one or more embodiments.

FIG. 4 illustrates another example system 400 for annealing an electrical component of a microscale integrated device in accordance with one or more embodiments. System 400 is the same as system 500 with the addition of a beam splitter exchanger 402 to the laser unit. Repetitive description of like elements employed in respective embodiments is omitted for sake of brevity.

In some embodiments, the laser unit 202 can include a beam splitter exchanger 402 that provides different diffractive beam slitter options that can be built into the laser unit 202 and rotated or exchanged as desired (e.g., as different settings) for different use cases. The different diffractive beam splitter options can provide different illumination patterns with different numbers and arrangements of optical beams. With these embodiments, the controller 204 can control the different beam formation settings and the mechanical rotation of the different diffractive beam splitters. For example, in some embodiments the beam splitter exchanger 402 can switch the diffractive beam splitter between two or more different types of diffractive beam splitters that provide different illumination patterns (e.g., the quad-pattern shown in FIG. 1, the different illumination patterns shown in FIGS. 3A-3D, or the like). The beam splitter exchanger 402 can also provide for removing the diffractive beam splitter entirely and using a single Gaussian beam for alternative anneal capabilities. In this regard, system 400 can be used to switch between annealing with a single Gaussian beam and multiple Gaussian beams.

Figure 5:
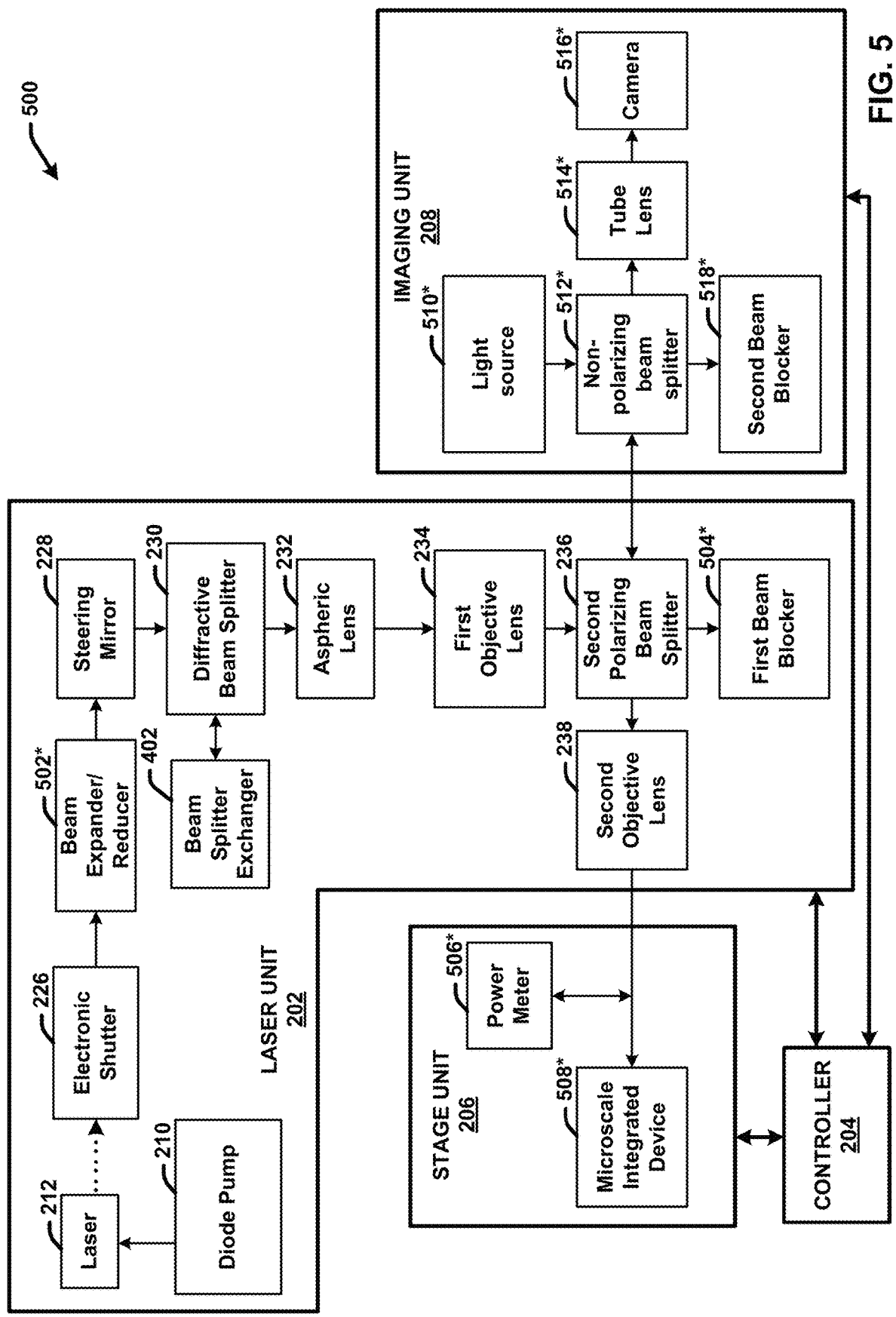
FIG. 5 illustrates another example system for annealing an electrical component of a microscale integrated device in accordance with one or more embodiments.

FIG. 5 illustrates another example system 500 for annealing an electrical component of a microscale integrated device in accordance with one or more embodiments. System 500 shown includes same or similar components, features and functionalities as system 200 and system 300 with some additional or alternative components (whose reference numerals are stared with an asterisk for ease of identification and distinction). The components in system 500 are depicted with boxes as opposed to structural icons as used in system 200 for ease of illustration. Some components shown in FIGS. 2 and 3 are removed in system 500 for brevity. It should be appreciated that these components are not removed in practice. Repetitive description of like elements employed in respective embodiments is omitted for sake of brevity.

System 500 provides for applying a thermal source (e.g., laser 212) to one or more electrical components of a microscale integrated device 508 to modify a state or property of the one or more electrical components. In various embodiments, the microscale integrated device 508 can be or include a qubit (e.g., qubit device 100) and the one or more electrical components can include a Josephson junction (e.g., Josephson junction 104). With these embodiments, system 500 can be used to indirectly heat and anneal the Josephson junction using a plurality of laser beams as discussed with reference to FIG. 2 and system 200. Additionally, or alternatively, the one or more other electrical components can include, but are not limited to, a thin film metal structure, a thin film metal structure formed with a superconducting metal, a thin film wire, an air bridge, an electrode, a capacitor and/or a resonator. The type of the microscale integrated device 508 can also vary and include other types of semiconductor devices.

System 500 includes laser unit 202, stage unit 206, controller 204 and imaging unit 208. The laser unit 202 can include substantially same and similar features and functionalities as previously described with reference to system 200 and system 300 with the addition of a beam expander/reducer 502 between the electronic shutter 226 and the steering mirror 228, and a first beam blocker 502 coupled to the second polarizing beam splitter 504. System 500 also inchoates a power meter 506 into the stage unit 206. The imaging unit 208 can include a light source 510, a non-polarizing beam splitter 512, a tube lens 514, a camera 516 and a second beam blocker 518.

The beam expander/reducer 502 can provide for expanding or reducing the size/diameter of the laser beam prior to passing through the diffractive beam splitter 230. For example, in some embodiments, the beam expander/reducer 502 can invert and reduce or expand the size of the beam by a factor of about 5. Reduction of the beam size by 5 can increase the intensity (e.g., optical intensity or light intensity) of the beam. In some embodiments, the intensity can be based on power per unit area (e.g., the downstream beams are concentrating more power in a smaller area, such as, the specific Josephson junction 104). In some embodiments, the beam expander/reducer 502 can be used to adjust the size of the beam and to adjust the field of view of the camera 516 of the imaging unit 208. For example, in one embodiment, the beam expander/reducer 502 can reduce the width/diameter of the beam from about 2 millimeters (mm) approximately five times down to about 400. Then, the first objective lens 224 and/or the second objective lens 238 can reduce the size of the beam or beams down to about 10 μm. In other embodiments, the beam expander/reducer 502 can be configured to increase the size of the beam.

The first beam blocker 504 can provide for blocking the second portion of the of the beams generated by the second polarizing beam splitter 236 that is directed away from the stage unit. In this regard, as discussed above, in some embodiments, the second polarizing beam splitter 236 can split the optical beams/illumination pattern output by the first objective lens 234 into two orthogonal, linearly polarized portions. The respective portions can essentially be mirror images or copies of one another. The second polarizing beam splitter 236 can reflect the first portion at a 90-degree angle toward the second objective lens 238 and the microscale integrated device 508, and the second portion can be transmitted though the second polarizing beam splitter 236 away from the microscale integrated device 508. In some embodiments, the first beam blocker 504 can provide an optional safety function to block exposure (e.g., by a sensitive person or object) to the second portion of the beams split by the second polarizing beam splitter 236. The first portion of the beams can travel through the second objective lens 238 and projected upon the microscale integrated device 508 to heat the microscale integrated device 508. In accordance with system 500, the power meter 506 can measure the power level of the first portion of the beams projected onto the sample from the second objective lens 238. For example, the power meter 506 can regularly and/or automatically collect power readings for the beams that are projected onto the microscale integrated device 508. In some embodiments, the power meter 506 can sit on a rail (not shown) and controlled by an actuator.

In some embodiments, the first portion of the beams (e.g., beams 205) may be reflected back from the microscale integrated device 508 back through the second objective lens 238 and the second polarizing beam splitter 236 as a reflected portion of the beams which coexists with the first portion of the beams but propagates in the opposite direction. In some embodiments, upon the second polarizing beam splitter 236 being exposed to the reflected beams, it may split the reflected beams into a third beam portion and a fourth beam portion. In some embodiments, the non-polarizing beam splitter 512, which is necessary for imaging, can be exposed to this reflected third portion.

In some embodiments, the non-polarizing beam splitter 512 can split this reflected third portion into a fifth portion and a sixth portion. Again noted, is that the fifth and sixth portions of the beam may each retain some of the original physical properties of the beams before being split by the non-polarizing beam splitter 512. Additionally, any of the components described below may be exposed to any of the portions of the beams.

In some embodiments, the non-polarizing beam splitter 512 may additionally be exposed to light emanating from the light source 510. The type of the light source 510 can vary. In some embodiments, the light source can correspond to an incoherent light source. For example, the light source can include one or more light emitting diodes (LEDs) that provide white light or green-light or white-light. Additionally, or alternatively, the light source can include a monochromatic light source. The light source 510 may have a 50 nanometers (nm) range. The non-polarizing beam splitter 512 may split the monochromatic light into a first and second portion of light. It is noted that the first and second portions of light may each retain some of the physical properties (e.g., the hue of light) of the light before being split by the non-polarizing beam splitter 512. Additionally, any of the components described below may be exposed to any of the portions of the light.

The non-polarizing beam splitter 512 may split light from the light source 510 and the third portion of the beam independent of the light and the beam's polarization. In some embodiments, the second beam blocker 518 may be exposed to the first portion of light from the light source 510 and the fifth portion of the beams from the non-polarizing beam splitter 512. In some embodiments, the first portion of light and the fifth portion of the beam may cease traveling on the imaging path.

In some embodiments, the second portion of the light may travel on the imaging path from the non-polarizing beam splitter 512 to the second polarizing beam splitter 236. The non-polarizing beam splitter 512 may then split the second portion of light from the light source 510 into a third portion of light and a fourth portion of light. In some embodiments, the first beam blocker 504 may be exposed to the third portion of light. The third portion of light may then cease travelling on the imaging path. In some embodiments, the second objective lens 237 may be exposed to the fourth portion of light, which propagates to the microscale integrated device 508. The microscale integrated device 508 may then have a reflected fourth portion of light, which coexists with the fourth portion of light but propagates in the opposite direction. The reflected fourth portion of light may then be split by the second polarizing beam splitter 236, adding to the fifth and sixth portions of light. The sixth portion of light may propagate towards the non-polarizing beam splitter 512 and split again into a seventh portion of light and an eight portion of light. The seventh portion of light may propagate towards the light source 510.

In some embodiments, the eighth portion of light and the sixth portion of the beam may travel on the imaging path from the non-polarizing beam splitter 512 to the tube lens 514. The tube lens 514 may have a 200 mm focal length and assist in imaging and alignment. In some embodiments, traveling from the tube lens 514, the eighth portion of light and the sixth portion of the beams may travel to the camera 516. The camera 516 may record the interaction of the beams 205 (and/or portions of the beams 205) on the microscale integrated device 508 and assist with the alignment of the beams 205 with the electronic component to be annealed on the microscale integrated device 508.

Figure 6:
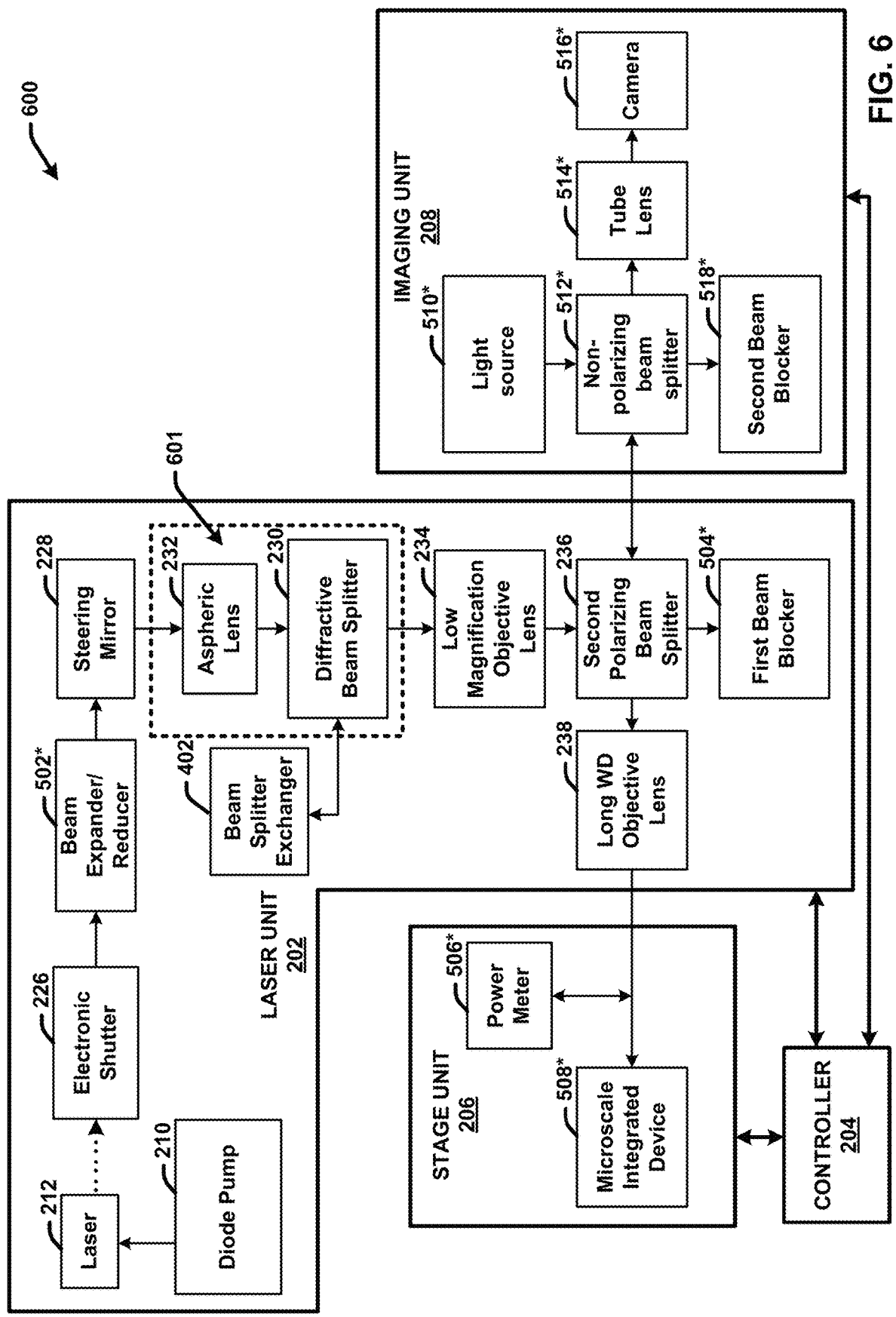
FIG. 6 illustrates another example system for annealing an electrical component of a microscale integrated device in accordance with one or more embodiments.

FIG. 6 illustrates another example system 600 for annealing an electrical component of a microscale integrated device in accordance with one or more embodiments. System 600 is substantially the same as system 500 with the difference being the position of the aspheric lens 232. As indicated by dashed box 601, in some embodiments, the aspheric lens 232 can be located between the steering mirror 228 and the diffractive beam splitter 230. Repetitive description of like elements employed in respective embodiments is omitted for sake of brevity.

Figure 7:
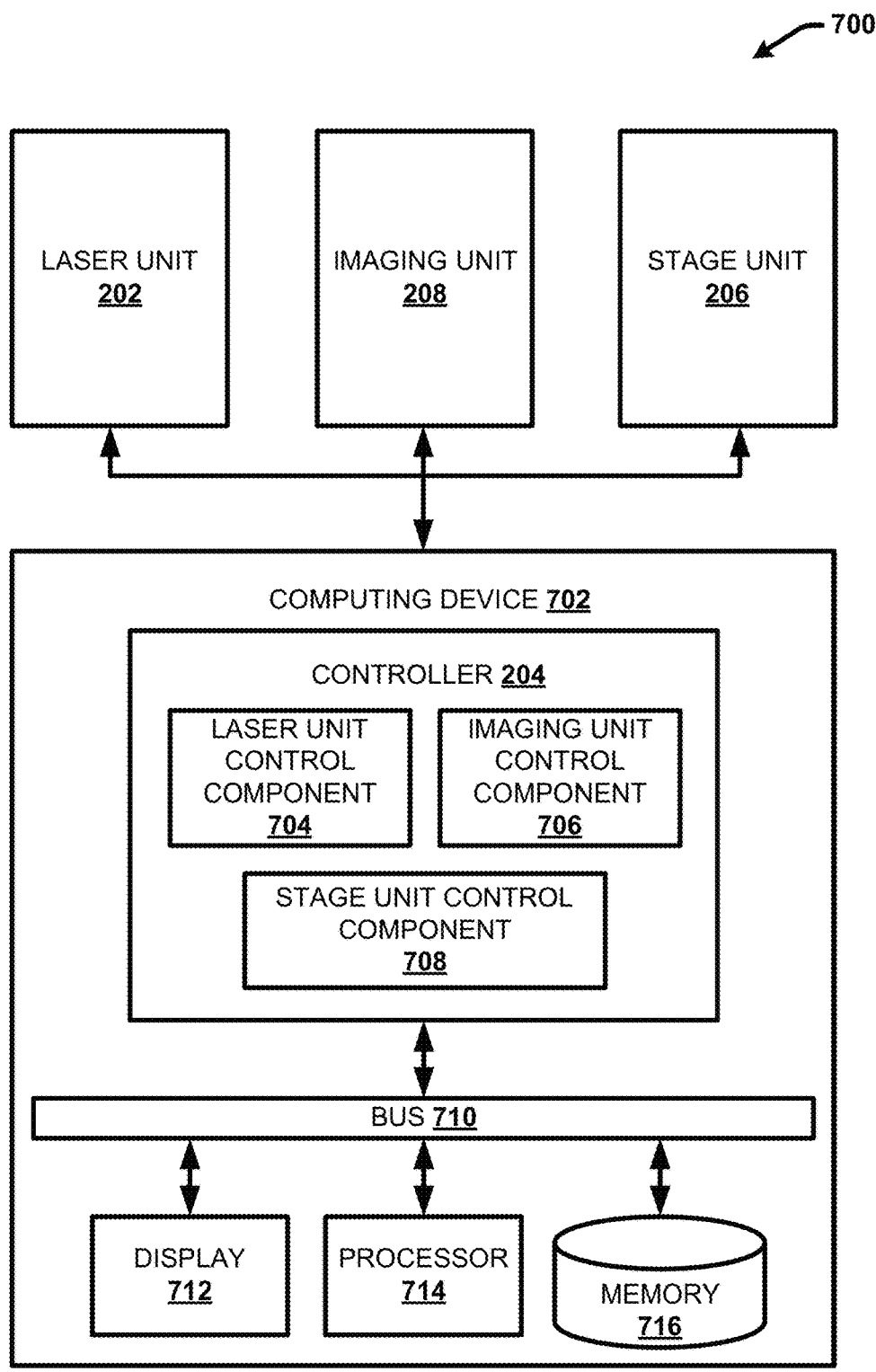
FIG. 7 illustrates another example system for annealing an electrical component of a microscale integrated device in accordance with one or more embodiments.

FIG. 7 illustrates another example system 700 for annealing an electrical component of a microscale integrated device in accordance with one or more embodiments. Repetitive description of like elements employed in respective embodiments is omitted for sake of brevity.

Embodiments of systems described herein can include one or more machine-executable components embodied within one or more machines (e.g., embodied in one or more computer readable storage mediums associated with one or more machines). Such components, when executed by the one or more machines (e.g., processors, computers, computing devices, virtual machines, etc.) can cause the one or more machines to perform the operations described. For example, system 700 can include a computing device 702 that can be communicatively and/or operatively connected to the laser unit 202, the imaging unit 208 and/or the stage unit 206. The computing device can include (or be operatively coupled to) the controller 204 which can be or include computer executable components for controlling one or more operations the laser unit 202, the imaging unit 208 and/or the stage unit 206.

For example, in the embodiment shown, the controller 204 can include a laser unit control component 704, an imaging unit control component 708 and a stage unit control component 708. In various embodiments, the laser control component can include computer executable instructions for controlling one or more operations of the laser unit 202 automatically and/or in response to user input (e.g., via a suitable input device). For example, with reference to FIGS. 6 and 7, the laser unit control component 704 can control the power level of the laser 212, the exposure duration of the electronic shutter 226 and the switching of the diffractive beam splitter 230 settings and corresponding illumination patterns (e.g., as controlled via the beam splitter exchanger 402). The imaging unit control component 706 can control one or more operations of the camera 516, the tube lens 514, the light source 510 the non-polarizing beam splitter 512 and the second beam blocker 518. With reference to FIGS. 5, 6 and 7, the stage unit control component 708 can control one or more operations of the power meter 506, the stage 240 and/or the water pump 242.

The computing system 500 can further include or be operatively coupled to at least one memory 716 and at least one processor 714. In various embodiments, the at least one memory 716 can store executable instructions (e.g., provided by the controller 204) that when executed by the at least one processor 714, facilitate performance of operations defined by the executable instructions. The computing device 702 can also include a display 712. In some embodiments, image data captured by the camera 516 can be rendered on the display 712 in association with facilitating alignment of the optical beams 205 with the target region on the microscale integrated device 508. The computing device 702 can further include a device bus 710 that communicatively couples the controller, the display, the processor and the memory 716 to one another. Examples of the processor 714 and memory 716, as well as other suitable computer or computing-based elements, can be found with reference to FIG. 11 and can be used in connection with implementing one or more of the systems or components shown and described in connection with FIG. 7 or other figures disclosed herein.

The computing system 702 can comprise any type of component, machine, device, facility, apparatus, and/or instrument that comprises a processor and/or can be capable of effective and/or operative communication with a wired and/or wireless network. All such embodiments are envisioned. For example, the computing system 702 can be or include a server device, a computing device, a general-purpose computer, a special-purpose computer, a tablet computing device, a handheld device, a server class computing machine and/or database, a laptop computer, a notebook computer, a desktop computer, a cellular phone, a smart phone, an industrial and/or commercial device, a digital assistant, a multimedia Internet enabled phone, and/or another type of device.

Figure 8:
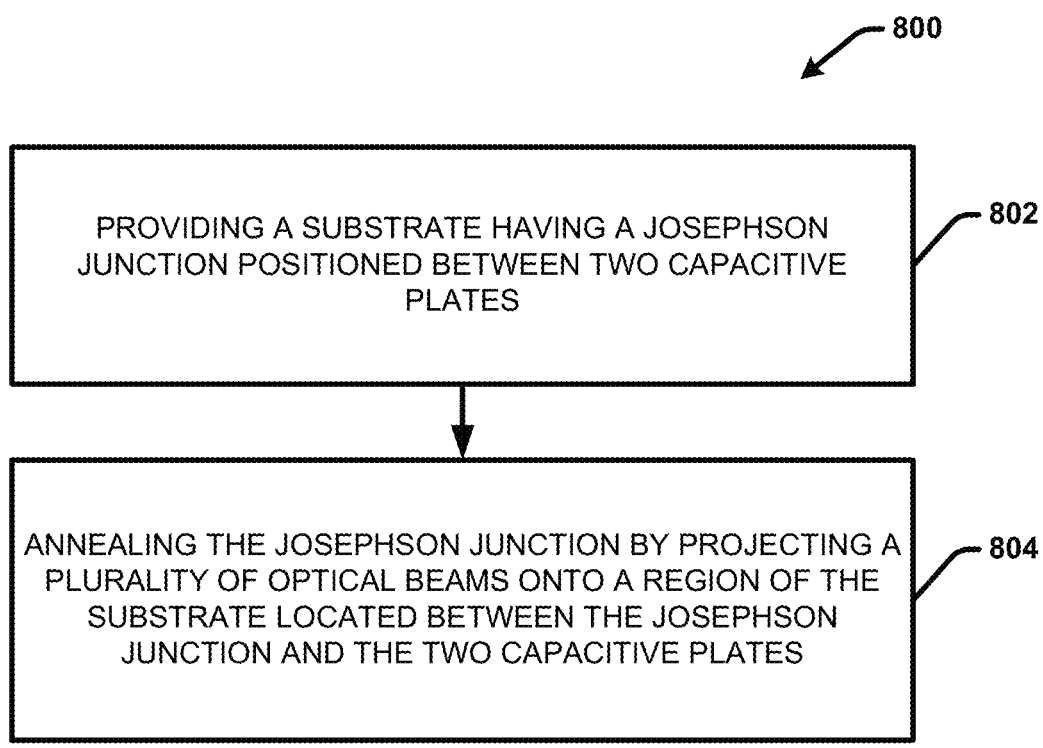
FIG. 8 illustrates a high-level flow diagram of an example, non-limiting method for forming a qubit in accordance with one or more embodiments.

FIG. 8 illustrates a high-level flow diagram of an example, non-limiting method 800 for forming a qubit (e.g., qubit device 100) in accordance with one or more embodiments. Repetitive description of like elements employed in respective embodiments are omitted for sake of brevity.

At 802, method 800 can comprise providing a substrate (e.g., substrate 102) having a Josephson junction (e.g., Josephson junction 104) positioned between two capacitive plates (e.g., capacitive plates 112). For example, in various embodiments, the substrate can be provided on stage of a laser annealing apparatus or system (e.g., system 200, system 300, system 500, system 600, system 700, or the like), and positioned in line-of-sight of one or more beam projecting components (e.g., low magnification objective lens 234, polarizing beam splitter 236, and long WD objective lens 238) of the annealing apparatus. At 804, method 800 can comprise annealing the Josephson junction by projecting (e.g., using low magnification objective lens 234, polarizing beam splitter 236, and long WD objective lens 238) a plurality of optical beams (e.g., optical beams 110, optical beams 205, or the like) onto a region of the substrate located between the Josephson junction and the two capacitive plates.

Figure 9:
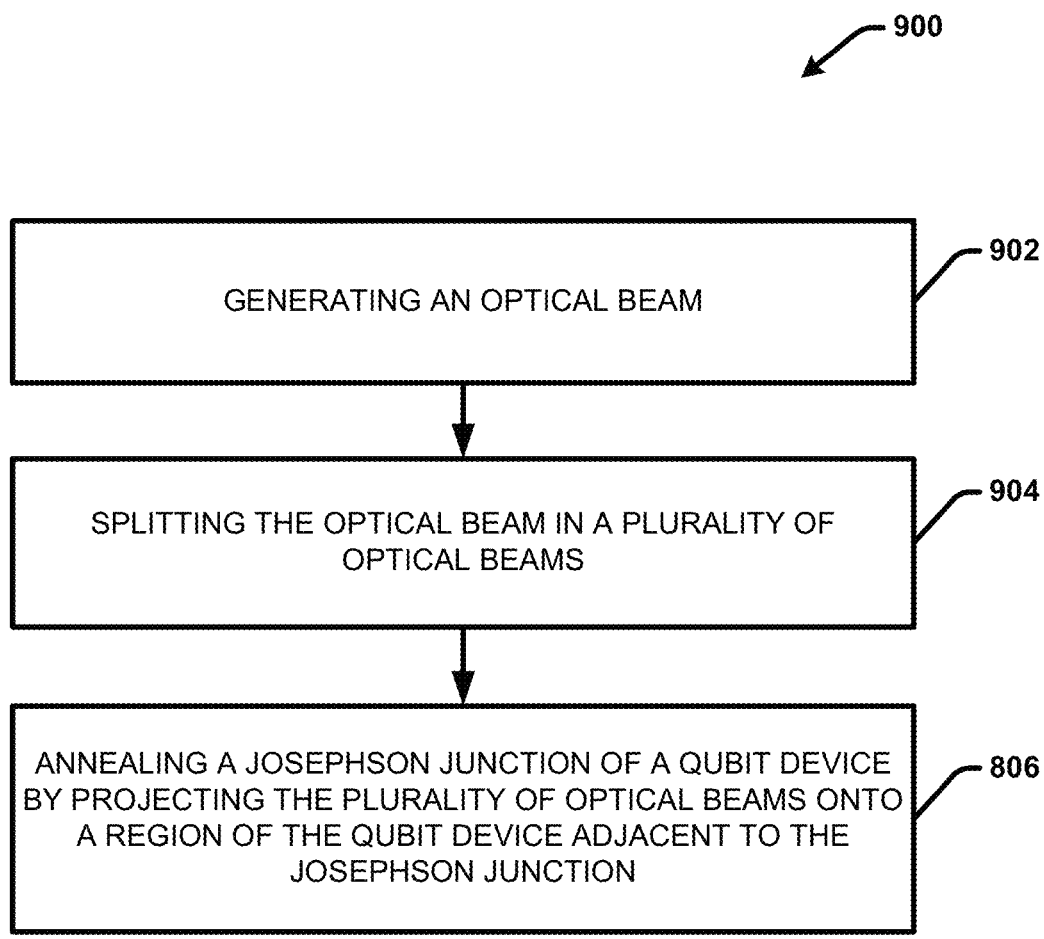
FIG. 9 illustrates a high-level flow diagram of an example, non-limiting method for tuning a qubit device in accordance with one or more embodiments.

FIG. 9 illustrates a high-level flow diagram of an example, non-limiting method 900 for tuning a qubit device (e.g., qubit device 100) in accordance with one or more embodiments. Repetitive description of like elements employed in respective embodiments are omitted for sake of brevity.

At 902, method 900 can comprise generating an optical beam (e.g., optical beam 201 using diode pump 210 and laser 212). At 904, method 900 can comprise splitting the optical beam in a plurality of optical beams (e.g., optical beams 203 using diffractive beam splitter 230). At 906, method 900 can comprise annealing a Josephson Junction (e.g., Josephson Junction 104) of the qubit device by projecting (e.g., using low magnification objective lens 234, polarizing beam splitter 236, and long WD objective lens 238) the plurality of optical beams onto a region of the qubit device (e.g., qubit device 100) adjacent to the Josephson Junction.

Figure 10:
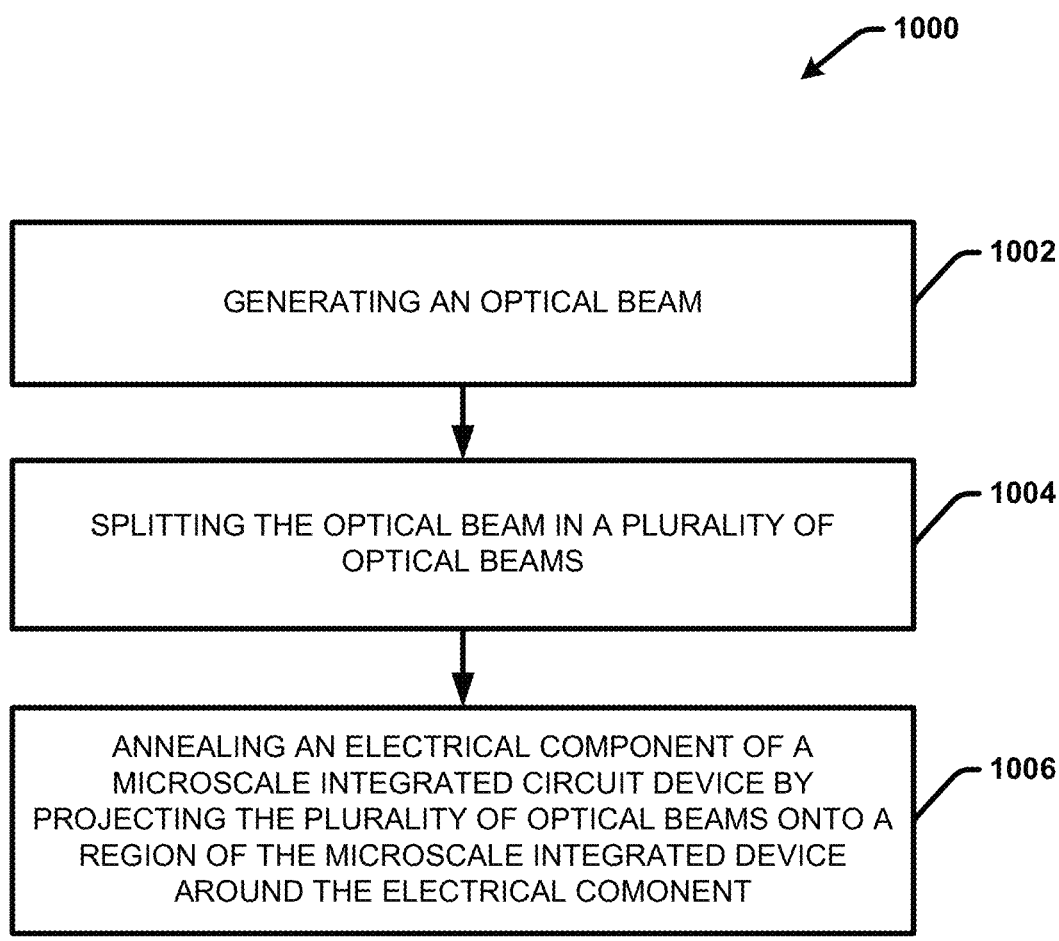
FIG. 10 illustrates a high-level flow diagram of an example, non-limiting method for tuning an electrical component of a microscale integrated device in accordance with one or more embodiments.

FIG. 10 illustrates a high-level flow diagram of an example, non-limiting method 900 for tuning an electrical component of a microscale integrated device (e.g., microscale integrated device 308) in accordance with one or more embodiments. Repetitive description of like elements employed in respective embodiments are omitted for sake of brevity.

At 1002, method 1000 can comprise generating an optical beam (e.g., optical beam 201 using diode pump 210 and laser 212). At 1004, method 900 can comprise splitting the optical beam in a plurality of optical beams (e.g., optical beams 203 using diffractive beam splitter 230). At 1006, method 100 can comprise annealing an electrical component of the microscale integrated device by projecting (e.g., using low magnification objective lens 234, polarizing beam splitter 236, and long WD objective lens 238) the plurality of optical beams onto a region of the microscale integrated device (e.g., qubit device 100) around the electrical component.

It should be noted that, for simplicity of explanation, in some circumstances the computer-implemented methodologies are depicted and described herein as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 11:
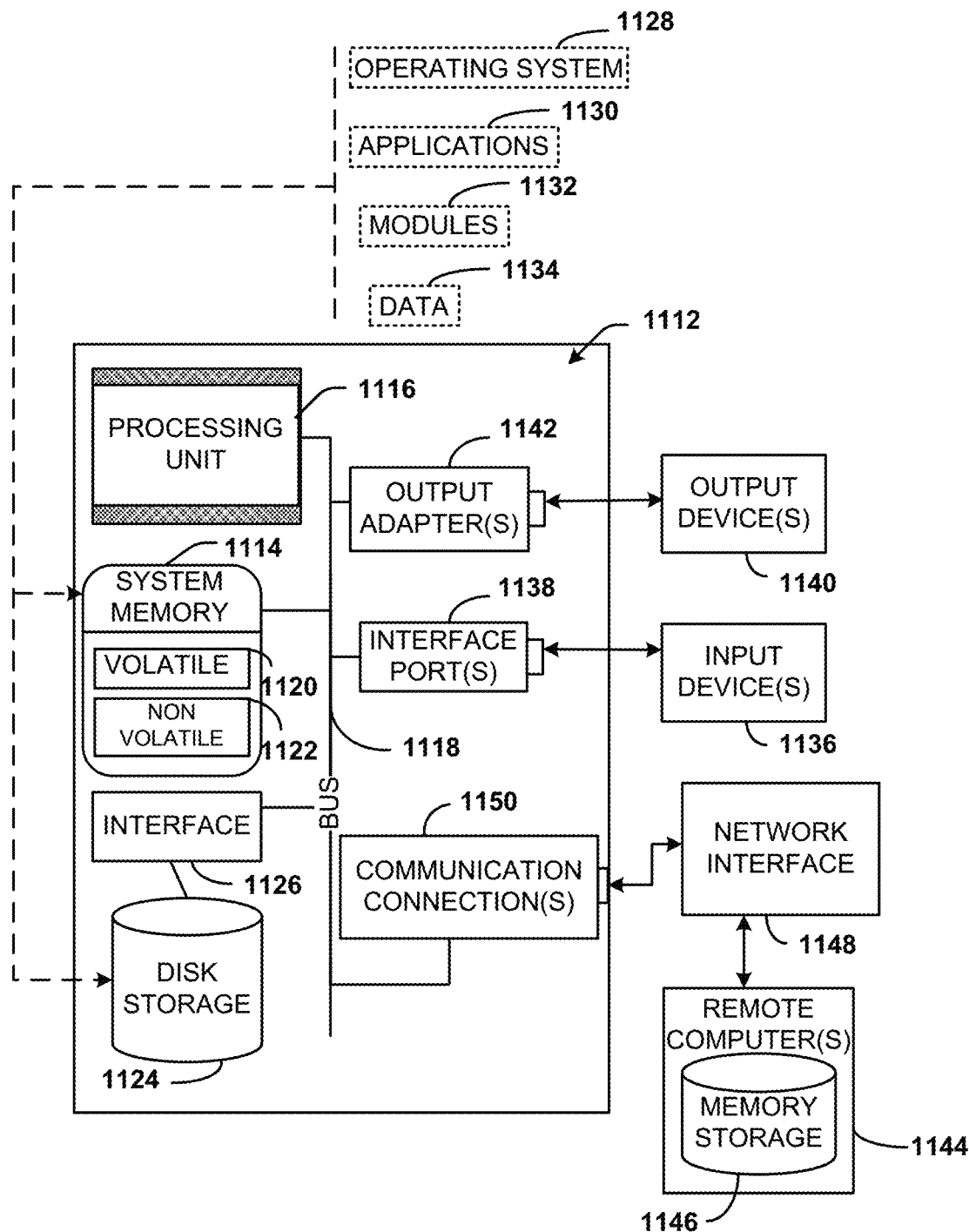
FIG. 11 illustrates a block diagram of an example, non-limiting operating environment in which one or more embodiments described herein can be facilitated.

FIG. 11 can provide a non-limiting context for the various aspects of the disclosed subject matter, intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity.

With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MCA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1194), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-110 drive, flash memory card, or memory stick. The disk storage 1124 also can include storage media separately or in combination with other storage media. To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

One or more embodiments described herein can be a system, a method, an apparatus and/or a computer program product at any possible technical detail level of integration. The computer program product can include a computer readable storage medium (or media) having computer readable program instructions thereon for causing a processor to carry out aspects of one or more embodiment. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. In this regard, in various embodiments, a computer readable storage medium as used herein can include non-transitory and tangible computer readable storage mediums.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of one or more embodiments can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of one or more embodiments.

Aspects of one or more embodiments are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and other devices to function in a particular manner, such that the computer readable storage medium having instructions stored therein comprises an article of manufacture including instructions which implement aspects of the function/act specified in the flowchart and block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and block diagram block or blocks.

The flowchart and block diagrams in the Figures illustrate the architecture, functionality, and operation of possible implementations of systems, methods, and computer program products according to various embodiments described herein. In this regard, each block in the flowchart or block diagrams can represent a module, segment, or portion of instructions, which comprises one or more executable instructions for implementing the specified logical function (s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and flowchart illustration, and combinations of blocks in the block diagrams and flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on one or more computers, those skilled in the art will recognize that this disclosure also can or can be implemented in combination with other program modules. Generally, program modules include routines, programs, components, data structures, etc. that perform particular tasks or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and a computer. By way of illustration, both an application running on a server and the server can be a component. One or more components can reside within a process or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that can provide specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

The term "facilitate" as used herein is in the context of a system, device or component "facilitating" one or more actions or operations, in respect of the nature of complex computing environments in which multiple components and/or multiple devices can be involved in some computing operations. Non-limiting examples of actions that may or may not involve multiple components and/or multiple devices comprise transmitting or receiving data, establishing a connection between devices, determining intermediate results toward obtaining a result (e.g., including employing machine learning and artificial intelligence to determine the intermediate results), etc. In this regard, a computing device or component can facilitate an operation by playing any part in accomplishing the operation. When operations of a component are described herein, it is thus to be understood that where the operations are described as facilitated by the component, the operations can be optionally completed with the cooperation of one or more other computing devices or components, such as, but not limited to: sensors, antennae, audio and/or visual output devices, other devices, etc.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches, and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a qubit, comprising:
providing a substrate having a Josephson junction positioned between two capacitive plates; and
annealing the Josephson junction, wherein the annealing comprises:
transmitting a laser beam through a path comprising a diffractive beam splitter that splits the laser beam into a plurality of optical beams that pass through an aspheric lens in the path to produce an illumination pattern comprising a plurality of spatially separated optical spots that are projected onto a region of the substrate located between the Josephson junction and the two capacitive plates, wherein the aspheric lens comprises a plurality of focusing areas associated with the plurality of spatially separated optical spots.

2. The method of claim 1, wherein the plurality of optical beams comprise Gaussian beams.

3. The method of claim 1, wherein the path comprises a steering mirror directly before the diffractive beam splitter.

4. The method of claim 1, wherein the plurality of spatially separated optical spots are respectively separated by a distance less than 20.0 micrometers.

5. The method of claim 1, wherein the plurality of spatially separated optical spots comprise at least four spatially separated optical spots.

6. The method of claim 1, wherein the Josephson junction comprises an aluminum/aluminum-oxide/aluminum trilayer Josephson junction.

7. The method of claim 1, wherein the plurality of optical beams indirectly heat the Josephson junction, resulting in the annealing of the Josephson junction.

8. The method of claim 1, further comprising:
altering a resistance of the Josephson junction as a result of the annealing.

9. A method for forming a qubit comprising:
providing a substrate having a Josephson junction positioned between two superconductor leads; and
annealing the Josephson junction, wherein the annealing comprises:
transmitting a laser beam through a path comprising a diffractive beam splitter that splits the laser beam into a plurality of optical beams that pass through an aspheric lens in the path to produce an illumination pattern comprising a plurality of spatially separated optical spots that are projected onto a region of the substrate adjacent to the Josephson junction and the two superconductor leads, wherein the aspheric lens comprises a plurality of focusing areas associated with the plurality of spatially separated optical spots.

10. The method of claim 9, wherein the plurality of optical beams comprise Gaussian beams.

11. The method of claim 9, wherein the path comprises a steering mirror directly before the diffractive beam splitter.

12. The method of claim 9, wherein the plurality of spatially separated optical spots are respectively separated by a distance less than 20.0 micrometers.

13. The method of claim 9, wherein the plurality of spatially separated optical spots comprise at least four spatially separated optical spots.

14. The method of claim 9, wherein the plurality of optical beams indirectly heat the Josephson junction, resulting in the annealing of the Josephson junction.

15. The method of claim 9, further comprising:
altering a resistance of the Josephson junction as a result of the annealing.

16. A method of tuning a qubit device, comprising:
generating an optical beam;
annealing a Josephson junction of the qubit device using the optical beam, wherein the annealing comprises:
transmitting a laser beam through a path comprising a diffractive beam splitter that splits the laser beam into a plurality of optical beams that pass through an aspheric lens in the path to produce an illumination pattern comprising a plurality of spatially separated optical spots that are projected onto a region of the qubit device adjacent to the Josephson junction, wherein the aspheric lens comprises a plurality of focusing areas associated with the plurality of spatially separated optical spots.

17. The method of claim 16, wherein the plurality of optical beams comprise Gaussian beams.

18. The method of claim 16, wherein the plurality of spatially separated optical spots comprise at least spatially separated optical spots.

19. The method of claim 16, further comprising:
altering a resistance of the Josephson junction as a result of the annealing.

* * * * *